United States Patent
Vu et al.

[11] Patent Number: 5,523,244
[45] Date of Patent: Jun. 4, 1996

[54] TRANSISTOR FABRICATION METHOD USING DIELECTRIC PROTECTION LAYERS TO ELIMINATE EMITTER DEFECTS

[75] Inventors: Truc Q. Vu, Signal Hill; Maw-Rong Chin, Huntington Beach; Mei F. Li, Mission Viejo, all of Calif.

[73] Assignee: Hughes Aircraft Company, Los Angeles, Calif.

[21] Appl. No.: 359,102

[22] Filed: Dec. 19, 1994

[51] Int. Cl.$^6$ .......................... H01L 21/265; H01L 49/00
[52] U.S. Cl. ........................ 437/31; 437/162; 437/909; 148/DIG. 10; 148/DIG. 124
[58] Field of Search ...................... 437/31, 228, 162, 437/32, 909

[56] References Cited

U.S. PATENT DOCUMENTS

| | | | |
|---|---|---|---|
| 4,483,726 | 11/1984 | Isaac et al. | 437/31 |
| 4,731,341 | 3/1988 | Kawakatsu | 437/31 |
| 4,830,972 | 5/1989 | Hamasaki | 437/31 |
| 4,975,381 | 12/1990 | Taka et al. | 437/31 |
| 5,204,276 | 4/1993 | Nakajima et al. | 437/31 |
| 5,244,533 | 9/1993 | Kimura et al. | 437/31 |
| 5,296,391 | 3/1994 | Sato et al. | 437/31 |
| 5,391,503 | 2/1995 | Miwa et al. | 437/31 |

OTHER PUBLICATIONS

Konaka et al., "A 30–ps Si Bipolar IC Using Super Self--Aligned Process Technology," IEEE Trans. Electronic Devices, vol. ED–33, pp. 526–531, Apr. 1986.

*Primary Examiner*—Tuan H. Nguyen
*Attorney, Agent, or Firm*—M. E. Lachman; M. W. Sales; W. K. Denson-Low

[57] ABSTRACT

A method for fabricating a super self-aligned bipolar junction transistor which reduces or eliminates emitter defects caused during critical etching steps by providing a non-critically thick dielectric etch stop (protection) layer (116) during all potentially damaging etching steps. An oxide or other dielectric layer (116, 130), is provided above the emitter region (152) of the semiconductor surface (110) during potentially damaging etching steps, such as dry etch procedures used to form critical device structures such as emitter opening 124 and sidewall spacers 146. Non-damaging etching procedures, such as wet etching, are used to remove dielectric protection layers (116, 130) to form less critical device structures, and/or form intermediate layer openings without damaging the silicon surface in the emitter (152), or other critical regions. The dielectric etch stop (protection) layers (116, 130) are non-critically thick and are fully removed from above an extrinsic base region (142) of the device by wet etching before forming the emitter (152) and base regions (142, 144). The method results in a more uniform, lower resistance base connection, higher chip yields, more uniform device properties, and greater device reliability.

18 Claims, 4 Drawing Sheets

5,523,244

TRANSISTOR FABRICATION METHOD USING DIELECTRIC PROTECTION LAYERS TO ELIMINATE EMITTER DEFECTS

BACKGROUND OF THE INVENTION

1. Field of the Invention

The present invention generally relates to methods of making semiconductor devices, and more particularly to a method of using dielectric etch stop layers to reduce or eliminate emitter defects during bipolar transistor fabrication.

2. Description of the Related Art

A process for fabricating high performance bipolar transistors is described in Konaka et al., "A 30-ps Si Bipolar IC Using Super Self-Aligned Process Technology," IEEE Trans. Electronic Devices, Vol. ED-33, pp. 526–531, Apr. 1986. The process includes a self-align technique using a single optical mask to provide the active regions of the transistor, including the emitter, emitter-base spacing, and the base contacts. In this process, however, unacceptable damage to the silicon surface, particularly in the emitter region, may occur during the etching away of device layers overlying the active area surface. Other self-align methods have similarly failed to avoid unacceptable damage to a semiconductor surface in an active area during fabrication steps. Preventing such damage is especially difficult during etching steps in which it is desirable to form very precise regions in the layers overlying the active area of the semiconductor substrate.

Transistor fabrication methods which do not adequately prevent emitter region damage, as described above, result in poorer and lower manufacturability of high performance bipolar transistors, less uniform device characteristics, and relatively low chip yields.

Accordingly, an object of the present invention is to avoid or minimize the above mentioned problems.

SUMMARY OF THE INVENTION

In carrying out principles of the present invention according to one embodiment thereof, there is provided a method for fabricating a super self-aligned bipolar junction transistor with an emitter substantially free of defects. In broad and general terms, the present invention provides a method of substantially eliminating emitter defects in a bipolar transistor by providing a dielectric etch stop layer above an emitter region in an active area of a semiconductor substrate during each step comprising the etching of any self-aligned transistor structures in the base-emitter region, excluding a step of etching an emitter contact region. This method preferably further includes the use of a highly selective etch procedure to remove the dielectric etch stop layer from above the emitter region of the substrate surface without substantially damaging the crystal lattice of the substrate in the emitter region.

In one broad aspect, the present invention provides a method of forming a semiconductor device structure, comprising the steps of: (a) providing a semiconductor substrate having an active area that includes portions wherein an emitter region and a base region are to be formed, said base region comprising an intrinsic region and at least one extrinsic region; (b) forming a first dielectric layer on the surface of the active area, said active area being disposed in said semiconductor substrate; (d) forming a doped contact layer above said first dielectric layer; (e) etching away a portion of said contact layer which is substantially aligned with an intrinsic base region of said active area, stopping said etching at said first dielectric layer; (g) removing the portions of said first dielectric layer which are aligned with an extrinsic base region of said active area; (l) etching away the portion of said first dielectric layer which is aligned with an emitter region; and forming base and emitter regions in said active area during subsequent drive-in procedures.

In a slightly more detailed aspect, the present invention provides a method of forming a semiconductor device structure, comprising the steps of: (a) providing an active area in a semiconductor substrate; (b) forming an oxide layer above said active area to a thickness of at least 100 angstroms; (c) forming a nitride layer above said oxide layer; (d) forming a doped base poly layer above said nitride layer; (e) forming an opening in said poly layer and said nitride layer, respectively, said opening being substantially aligned with an intrinsic base region to be subsequently formed in said active area; (f)(1) forming nitride spacers on opposing vertical walls of said opening formed during step (e); (f)(2) forming an oxide between said nitride spacers; wherein a thickened oxide layer is provided above said emitter region; (g)(1) etching at least one gap in said nitride layer, said gap being aligned above an extrinsic base region; (g)(2) etching said oxide layer from the surface of said substrate in said gap; (h)(1) depositing poly layer material in said removed portions of step (g) and in said opening of step (e); (h)(2) removing the portion of said contact layer material which is aligned with said intrinsic base region while a portion of oxide layer of step (b) protects the active area surface; (i) forming base regions by (1) driving-in dopant from the base poly layer into the active area to form doped extrinsic base regions, and (2) implanting ions into the active area to form a doped intrinsic base region; (j) forming an oxide on the inner surfaces of said opening of step (e); (k) forming nitride sidewall spacers disposed in said opening of step (e), said spacers substantially aligned at opposing ends of said emitter region; (l) etching any oxide remaining above said emitter region; and forming an emitter structure by forming a doped emitter poly layer in the opening of step (e), by masking and etching the emitter poly to form an emitter contact, and by driving-in dopant from said emitter poly to form an emitter region in said active area; in which step (e) and substep (h)(2) each comprise a reactive ion etch during which said oxide layer acts as an etch stop; in which substep (g)(1) further comprises a wet nitride etch and substep (g)(2) comprises a wet oxide etch having high selectivity; and wherein damage to said semiconductor surface in said active area is substantially prevented during etch steps (e), (f)(1), (g)(1), (h)(1), and (k) by an oxide etch stop layer and wherein damage to said semiconductor surface is also prevented during etch steps (g)(2) and (l) by using a high selectivity oxide etch procedure.

The present method reduces or eliminates emitter defects caused during critical etching steps. Defects are eliminated by providing a dielectric etch stop (protection) layer during all potentially damaging etching steps, such as during dry etching procedures. Damage due to etching polysilicon, or contact layer material, from the substrate surface is prevented by providing an intervening dielectric (oxide) etch stop layer. The etch stop layer is then fully removed from an extrinsic base region, providing lower, more uniform base resistance devices than those produced using sacrificial oxide methods.

Thus, in one broad aspect, the present method provides an oxide protection layer above the emitter region of the semiconductor surface during dry etch procedures. Dry etching is generally preferred to form critical or precisely shaped device structures. However, dry etching processes generally cause unacceptable damage in the emitter region due to over-etching which is not adequately prevented by an etch stop layer. Such damage is substantially prevented or minimized by the etch stop techniques discussed herein. Less damaging etching procedures, including certain wet etching procedures, are also used to remove dielectric protection layers, to isotropically form certain device structures, and/or to form intermediate layer openings without damaging the emitter region or other device regions. The present method also minimizes or eliminates the "wetting" problem associated with wet etching steps. The wetting problem occurs when etching solutions are prevented from coming in contact with very tiny device structures due to the smallness of openings in the region to be etched.

The dielectric etch stop layers are non-critically thick. For example, an oxide etch stop layer may be formed to be thicker than, say 100 angstroms. Dielectric layers of lower thicknesses would need to be critically formed to effectively prevent defects during dry etching and to facilitate other process steps. For example, sacrificial oxide layers with a thickness of 10–20 angstroms must be critically or very carefully formed in order to prevent damage to underlying regions during anisotropic dry etching, such as reactive ion etching (RIE). Conversely, oxide layers in excess of approximately 100 angstroms, as used in the present invention, are easily or non-critically formed and are also effective for preventing emitter damage during dry etching. The thicker layers are less costly.

Further, the present method provides for the removal of the portions of the oxide etch stop layer which are aligned with the extrinsic base regions of the transistor, prior to forming the emitter and base regions. This removal is accomplished by wet etching the oxide without substantially damaging the substrate surface of the extrinsic base region. Removing the oxide above the extrinsic base regions provides transistors with more uniform, lower resistance base connections. This, combined with the elimination of emitter defects, also provides higher chip yields, more uniform device properties, and greater device reliability.

The process is adaptable to the concurrent fabrication of complementary bipolar transistors, and also to the fabrication of complementary metal oxide semiconductor (CMOS) transistors on the same wafer. Although disclosed with respect to a silicon substrate, principles of the present invention are adaptable to fabricating bipolar transistors using other substrate materials, including but not limited to germanium, gallium arsenide, group III–V compounds and group II–VI compounds.

These and other features and advantages of the present invention will be apparent to those skilled in the art from the following detailed description, taken together with the accompanying drawings.

DETAILED DESCRIPTION OF THE INVENTION

Figure 1:
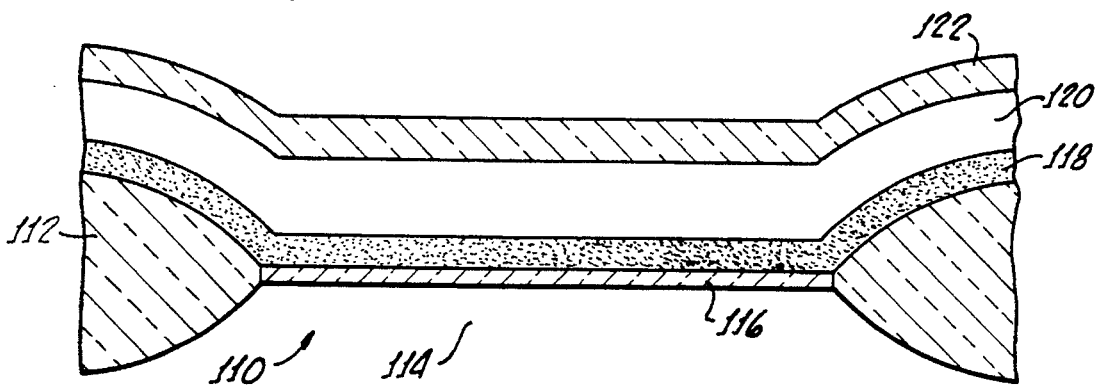
FIGS. 1–10 are sectional fragmentary views showing successive stages in the fabrication of a semiconductor structure in accordance with one embodiment of the invention, in which the fabrication proceeds in the emitter-base region of a bipolar transistor.

As illustrated in FIG. 1, an active area 110 of a semiconductor substrate 114 is formed during step (a) by a conventional localized oxidation (LOCOS) process. The active area 110 comprises the portion of the semiconductor substrate 114 disposed between adjacent field oxide regions 112. The semiconductor substrate is preferably comprised of silicon (Si), although principles of the present invention are adaptable for use with other semiconductor materials and dielectric materials than those particularly mentioned in the present disclosure.

After the active area 110 is formed, any residual oxide is stripped from the semiconductor surface in the active area. Then, during step (b), a first dielectric layer comprising a non-critically thick oxide layer 116 ($SiO_2$) is formed on the surface of the semiconductor substrate 114 in the active area 110, between the field oxide regions 112. Oxide layer 116 is formed by thermal oxidation or other suitable process, preferably to a thickness of approximately 300 angstroms. However, the precise thickness of oxide layer 116 and the degree of care used in forming it are not critical, hence it may be termed "non-critically thick." The oxide layer 116 acts as a nitride etch stop layer during subsequent etching in step (e) of the present method.

In a preferred set of steps, step (c) follows step (b). During step (c) a second dielectric layer, or nitride layer 118 ($Si_3N_4$), is deposited on the top surface of oxide layer 116. Nitride layer 118 is preferably deposited to a thickness of between 1000 and 2000 angstroms using chemical vapor deposition (CVD) or other suitable process.

Following step (c) in a preferred set of steps, step (d) comprises forming a doped contact layer, or base polysilicon (poly) layer 120, on the top surface of nitride layer 118. Contact layer 120 is preferably formed to a thickness of between 2000 and 4000 angstroms using CVD or other suitable process. The poly contact layer 120, or base poly, is then doped with impurity ions using ion implantation. If it is desired to form an npn transistor, p-type doping is performed. If it is desired to form an pnp transistor, n-type doping is performed. Note that in an alternative set of steps, step (c) is omitted from the present method (no nitride layer 118 is formed) and step (d) follows step (b) directly.

After the base poly or contact layer 120 is formed in step (d), a dielectric isolation layer, or oxide isolation layer 122, is preferably formed to a thickness or approximately 3000 angstroms. This layer provides electrical isolation in the completed transistor device between the base poly 120, the emitter poly 154 (to be formed in a subsequent step), and the subsequently formed metal connections.

Figure 2:
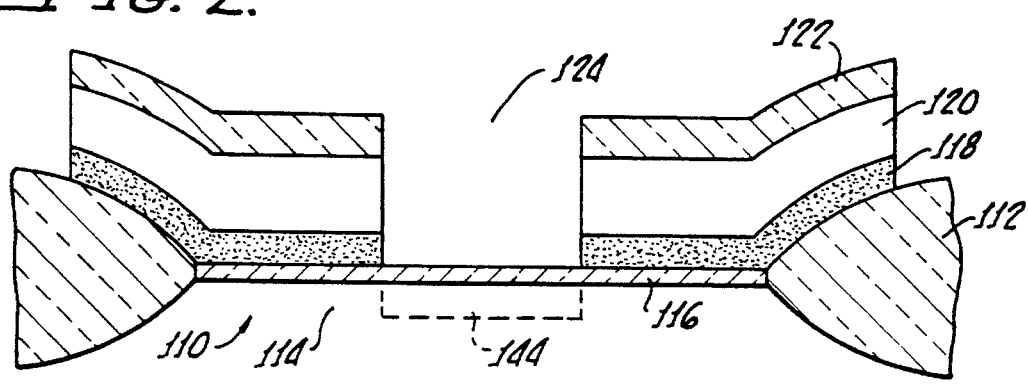

Following step (d), step (e) comprises etching away a portions of isolation layer 122, contact layer 120, and nitride layer 118 which are substantially aligned with an intrinsic base region 144 (shown in FIGS. 2, 6 and 8), which will subsequently be formed in the active area 110, during a drive-in process "B" as described below. As illustrated in FIG. 2, step (e) results in the formation of an emitter contact opening 124 through oxide isolation layer 122, contact layer 120 and nitride layer 118. During this step, emitter contact opening 124 is precisely formed by an anisotropic dry etch process, while non-critically thick oxide layer 116 protects the surface of the silicon substrate 114 in the emitter-base region 144 at the bottom of emitter opening 124.

Preferably, step (e) comprises an anisotropic reactive ion etch (RIE) procedure. In an anisotropic procedure, the etching rate differs in the vertical and the horizontal directions. The use of an anisotropic etch allows for the precise formation of the opposing vertical walls of emitter contact opening 124. The opposing vertical walls of emitter contact opening 124 are precisely formed in order to properly complete the super self-aligned structure of the bipolar transistor.

In a manufacturing environment the polysilicon contact layer 120 is not of uniform thickness across the wafer surface or from one wafer to another. Also, the polysilicon contact layer 120 is thicker in locations where it is deposited over underlying structures that stick up above the planar surface. The non-uniform thickness variation of the contact layer 120, combined with the etch rate variation of an anisotropic (RIE) process requires approximately 30% to 80% over etching into the underlying etch stop layer. Therefore, a thin oxide layer, such as a sacrificial oxide layer 10–20 angstroms thick, is inadequate for preventing etching damage to the active emitter region. Thus, use of sacrificial oxide layer techniques occasionally result in damage to the emitter region of the active area surface. This, in turn, leads to several costly problems, including the fabrication of transistors (1) with non-uniform device characteristics that exhibit parameter variation from device to device, (2) that fail or are unreliable in actual use, and/or (3) that don't work at all, thus contributing to low chip yields from the fabrication process.

Accordingly, the present method avoids horizontal overetching problems during step (e) by providing non-critically thick oxide layer 116 as a stop etch layer. The preferable 300 angstrom thickness of layer 116 is more than adequate to prevent emitter-base area damage due to horizontal overetching during anisotropic dry etching to form the emitter opening 124 in step (e). Furthermore, the method and care needed to produce oxide layer 116 is very low compared to that required to form a thin sacrificial oxide layer of, say, 10–20 angstroms thickness.

Figure 3:
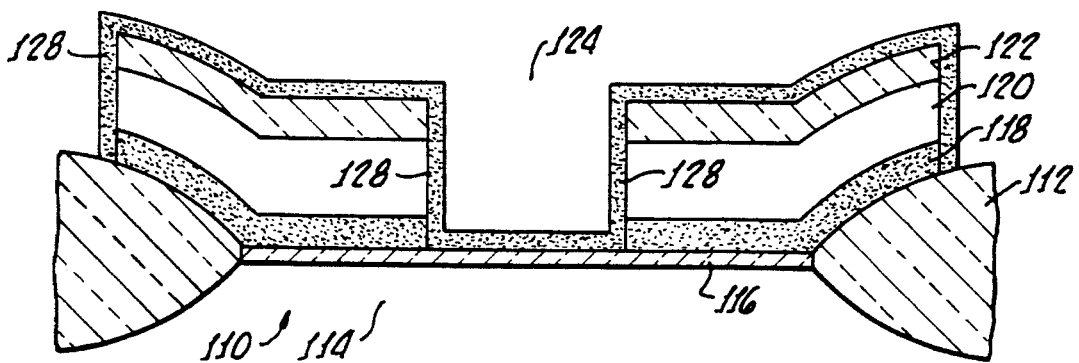
Figure 4:
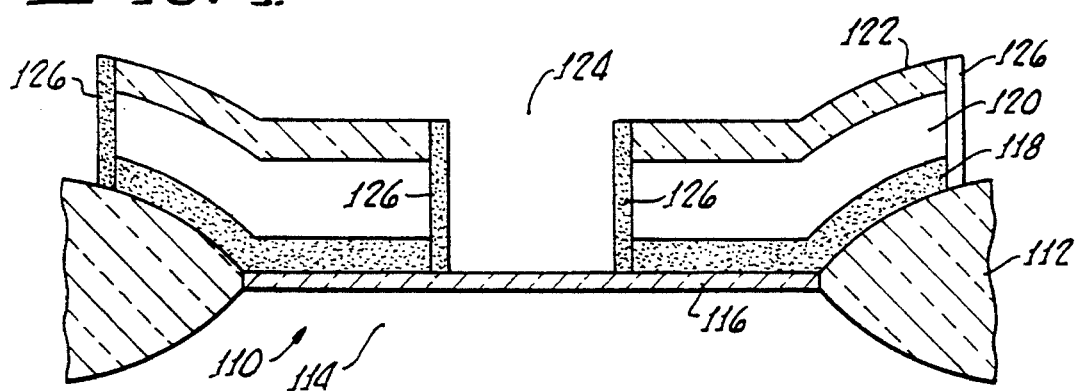
Figure 5:
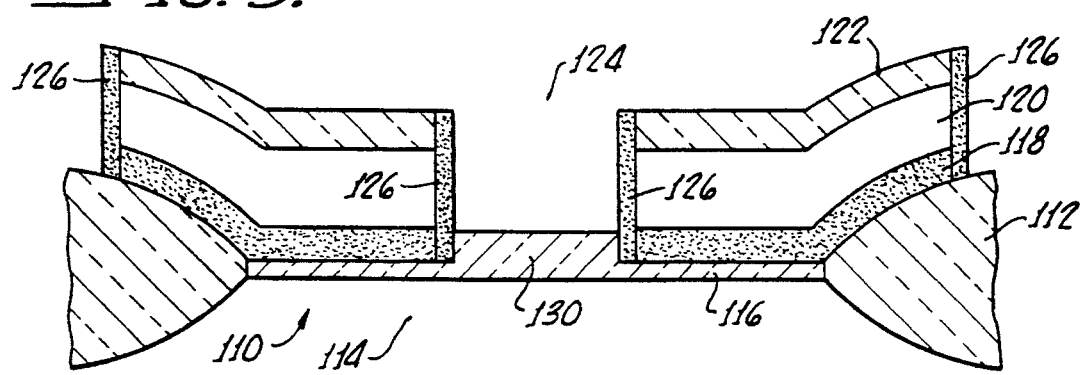

As illustrated in FIGS. 3–5, a next step (f) is performed to thicken a portion 130 (FIG. 5) of oxide layer 116 which is substantially aligned with intrinsic base region 144 (subsequently formed as described below) of the active area 110. As illustrated in FIG. 5, thickened oxide layer 130 protects the emitter-base region of the active area 110 during a wet etch procedure to be performed during a step (g), as discussed below.

Preferably, step (f) is performed as a set of substeps comprising a localized oxidation process in which dielectric spacers or oxidation blocking spacers 126 (FIG. 4) are formed in a substep (1) and then thickened oxide 130 is formed between masks 126 in the emitter contact opening 124 in a substep (2). As illustrated in FIG. 3, blocking spacers 126 are formed during substep (f)(1) by depositing a blanket nitride layer 128 to a thickness of approximately 400 angstroms using a CVD process. Then the horizontal portions of the nitride layer 128 are removed after masking side portions 126, using an anisotropic dry etch procedure such as RIE, leaving the arrangement shown in FIG. 4. As illustrated in FIG. 4, the anisotropic etch is preferred to form the oxidation blocking spacers 126 on the vertical side walls of the contact layer 120 in the emitter opening 124. Note that oxide layer 116 protects the emitter-base region during substep (f)(1) in the active area 110 from over-etching during the dry etch of the nitride, just as it did during step (e) above. Note that nitride spacers 126 are also formed above the field oxide regions 112 during this step, providing protection to the edges of base polysilicon 120, dielectric isolation layer 122, and nitride layer 118 during subsequent etching steps.

As illustrated in FIG. 5, during the next substep (f)(2), thermal oxidation is used to grow or form thickened oxide layer 130 to a thickness of approximately 800 angstroms in the space between blocking spacers 126 at the bottom of emitter contact opening 124. The blocking spacers 126 block or mask the formation of oxide on the vertical side walls of emitter opening 124 during this step. The space between blocking spacers 126 is precisely controlled during step (f)(2) to be substantially aligned with intrinsic base region 144, which is yet to be formed. Therefore, oxide layer 116 is thickened to provide oxide layer 130 only in that portion which is aligned with the region of active area 110 which will later form the intrinsic base region 144.

Figure 6:
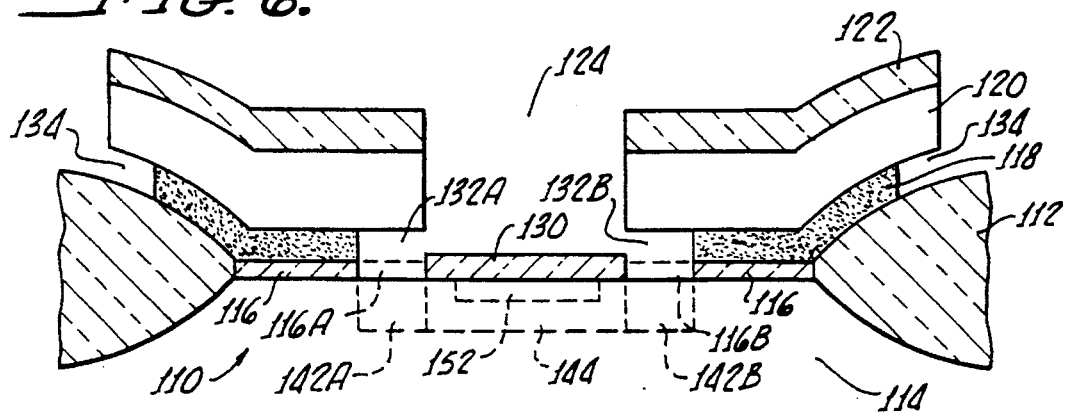

As illustrated in FIG. 6, the next step (g) comprises removing the portions 116A and 116B of oxide layer 116 which are aligned with the regions of the active area 110 that will subsequently be formed into the extrinsic base regions 142A, 142B, respectively. Oxide removal is accomplished by undercutting the nitride layer 118 and oxide layer 116 beneath the polysilicon layer 120 on either side of the emitter opening 124. This is preferably accomplished using two successive wet etch procedures in substeps (g)(1) and (g)(2), respectively.

In substep (g)(1), a nitride wet etch is used to undercut or etch away that portion of nitride layer 118 which is substantially aligned with the yet to be formed extrinsic base regions 142A, 142B. The oxidation blocking spacers 126 are also substantially dissolved (etched away) during this step. This etch is preferably accomplished isotropically using a relatively high temperature phosphoric acid solution. Isotropic etching occurs at substantially the same rate in both the vertical and horizontal directions.

Preferably 2000 to 5000 angstroms of nitride layer 118 is undercut or etched away in substep (g)(1), forming undercut gaps 132A, 132B (FIG. 6) beneath contact layer 120 and above oxide layer 116 on opposing sides of the emitter contact opening 124. Actually, the alignment of the undercut gaps 132 substantially determine the location of extrinsic base regions 142A, 142B formed during a subsequent drive-in step "A", described below. The dashed lines in FIG. 6 indicate that portions of oxide layer 116A and 116B provide an etch stop to protect emitter-base region 142a, 142b during substep (g)(1). Thickened oxide layer 130 also provides a protective etch stop in the emitter-base region.

During the next substep (g)(2), the portions 116A and 116B of oxide layer 116 which are aligned with extrinsic base regions 142A, 142B, respectively, are etched away using a oxide wet etch process. This etch, which also removes part of layer 130, is preferably controlled so that at least 100 angstroms of thickened oxide layer 130 remains in the emitter-base region, while all of the oxide layer 116A and 116B is removed from the active area surface where it is substantially aligned with the extrinsic base regions 142A and 142B, respectively. Hence, undercut gaps 132 are widened in this step to include the dashed regions 116A and 116B.

Substep (g)(2) preferably uses a hydrofluoric acid (HF) buffer solution with a controlled immersion time to etch the oxide layer 116. This minimizes or prevents damage to the substrate surface in the extrinsic base regions 142A, 142B of the active area 110. By fully removing the oxide portions 116A and 116B in this manner, the present method advantageously provides for the fabrication of transistors having relatively lower and more uniform values of base resistance than those transistors which are fabricated using thermal break-up process to eliminate analogously positioned oxide portions.

Figure 7:
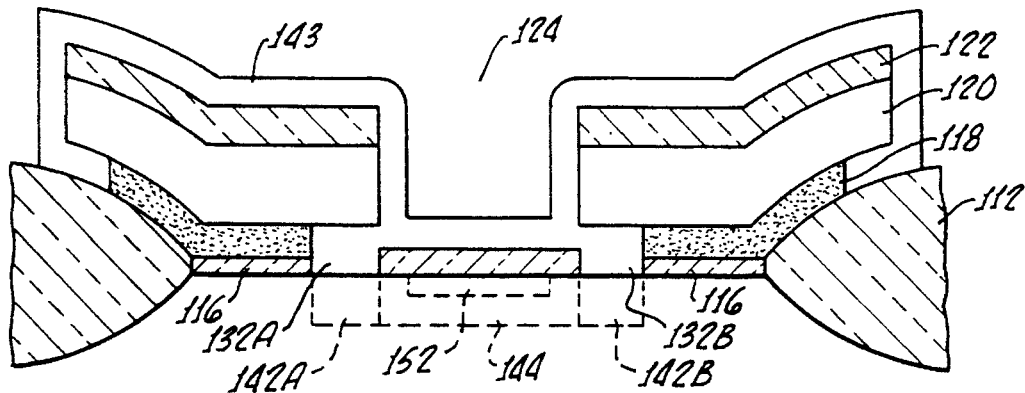
Figure 8:
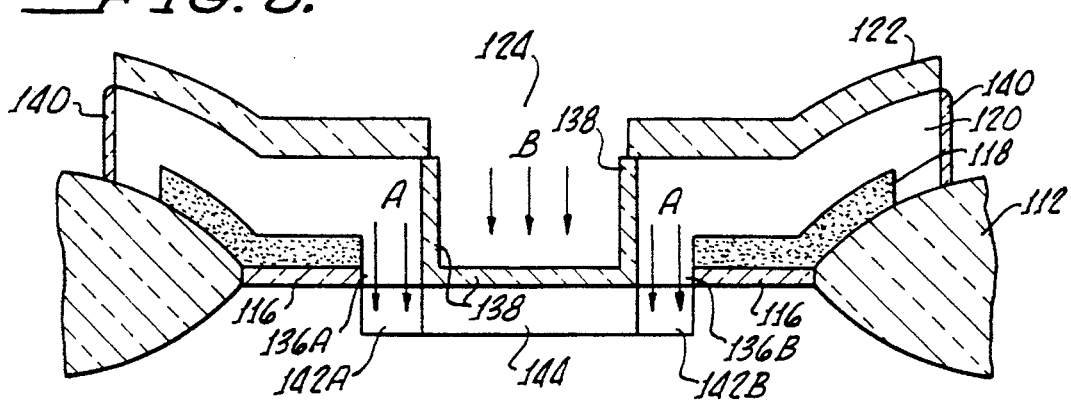

As illustrated in FIGS. 7–8, step (h) preferably follows step (g), in which contact layer refills 136A and 136B (FIG.

8) are formed in the undercut gap regions 132. Step (h) in turn preferably comprises substeps (h)(1) and (h)(2) in which polysilicon contact layer material 143 is deposited in blanket form and then etched.

During substep (h)(1), a layer of polysilicon 143 is preferably deposited by a CVD process to a thickness sufficient to refill the undercut gap regions 132A and 132B with polysilicon material. This thickness is preferably in the range of approximately 1500 angstroms. Polysilicon 143 is also deposited at the bottom of emitter contact opening 124, atop the partially removed thickened oxide region 130, during this step.

Figure 10:
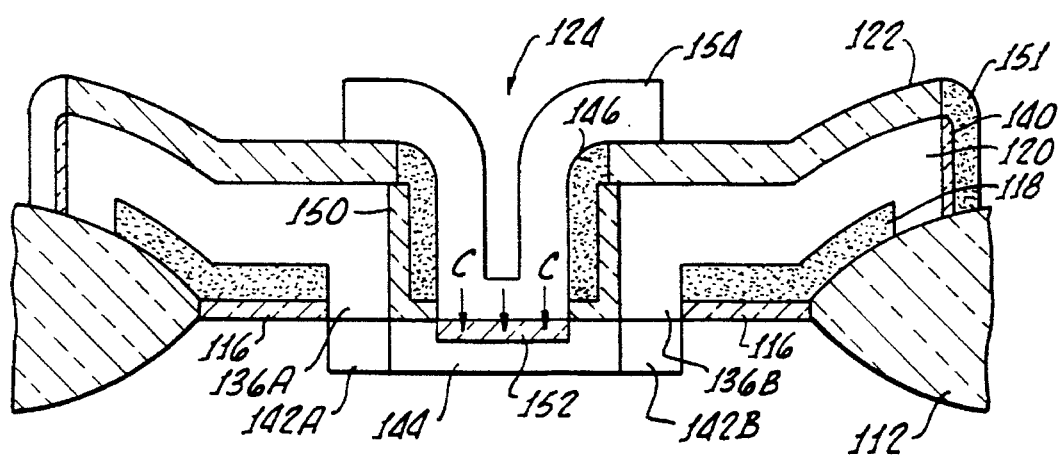

During substep (h)(2), the portion of the blanket polysilicon layer 143 which is substantially aligned with the intrinsic base region 144 (subsequently formed as described below) is etched away (see FIG. 8) using an isotropic etch procedure which can be a wet or dry etch. During this etch, the remaining portion of thickened oxide layer 130 protects the emitter-base region of the active area 100, preventing defects from being caused in the region of the active area 110 which will later be formed into the emitter region 152 (as shown in FIG. 10).

As illustrated in FIG. 8, during a step (i), base regions 142A, 142B are formed using the substeps of (1) driving-in dopant from the contact layer 120 into the active area 110 of the substrate 114 to form extrinsic base regions 142A and 142B, as illustrated by the arrows labelled "A"; and (2) implanting dopant ions into the active area 110 of the substrate 114 to form intrinsic base region 144, as illustrated by the arrows labelled "B". Note that during dopant implant step "B", implantation is performed through a remaining portion of thickened oxide layer 130 (some of the thickness erodes due to over-etching or isotropic etching in prior steps). This helps minimize defects in the intrinsic base region 144 of the substrate. During a step (j), a relatively thin oxide mask 138 (FIG. 8) is grown or formed on the side wall and bottom surfaces of emitter contact opening 124. Thin oxide mask 138 is preferably formed to a thickness of approximately 200 angstroms on the inner surfaces of emitter contact opening 124 by thermal oxidation. Oxide regions 140 are also formed above field oxide regions 112 during this step. Oxide regions 140 provide electrical isolation from adjacent regions on the semiconductor chip, which may comprise collector regions or other devices.

Figure 9:
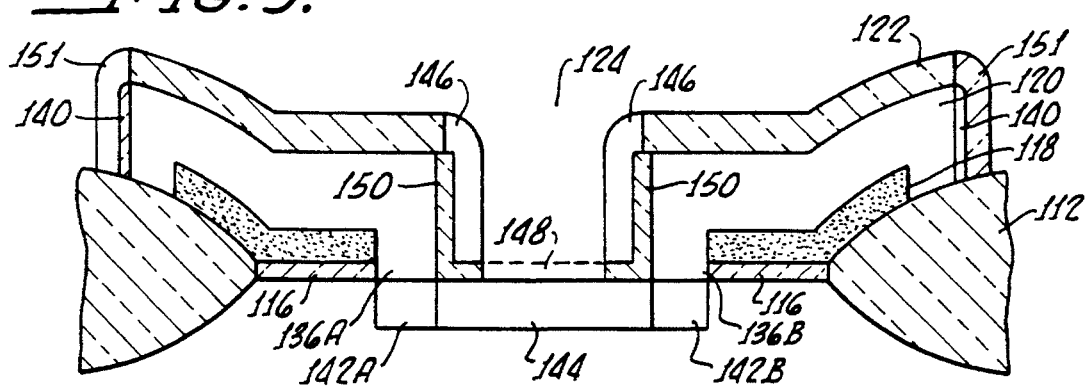

As illustrated in FIG. 9, during a following step (k), sidewall spacers 146 are formed by depositing and etching an approximate 2000 to 3000 angstrom thick nitride layer. CVD is preferably used to deposit the layer in blanket form during a substep (k)(1). Then anisotropic dry etching is preferably used to precisely form the sidewall spacers 146 during a substep (k)(2). The sidewall spacers 146 are disposed on opposing walls of emitter contact opening 124. The inside edges of spacers 146 are aligned with the emitter region 152 (shown in FIG. 10) of the active area 110. The dry, preferably RIE etch, forms the sidewall spacers 146 in relatively precise alignment to guide the subsequent formation of emitter region 152, as described below. The bottom portion 148 of oxide mask 138 (FIG. 8) again prevents emitter damage by acting as an etch stop to prevent over-etching since the oxide portion 148, indicated by the dashed line, is in place to act as an etch stop layer.

In a preferred set of steps, step (l) follows step (k) and comprises etching away the portion 148 of the thickened first dielectric layer which is in alignment with the emitter region 152 (FIG. 10) of the active area 110. This etch removes any portions of first dielectric (oxide) layer 116, thickened oxide 130, and oxide mask 138 which may still remain in the emitter opening 124 above the emitter region 152. This step preferably comprises an oxide wet etch using a buffer solution such as hydrofluoric acid (HF) which provides high selectivity for etching oxide to silicon for preventing damage to the emitter region 152 of the substrate surface. The dashed line in FIG. 9 indicates also the resulting opening 148 in oxide mask 138 that results from oxide removal during step (l). Sidewall isolation regions 150, comprising the remaining portions of oxide mask 138 which remain after oxide removal in step (l), become part of the finished device structure.

Finally, as illustrated in FIG. 10, emitter contact 154 and emitter region 152 are formed in conventional fashion. To do so, an emitter polysilicon layer is deposited and doped using ion implantation. The poly surface is treated by a salisidation process to lower its resistance. The emitter poly layer is then masked and etched to form emitter contact 154. The emitter region 152 is formed by dopant being driven-in from the emitter contact 154 to the active area 110 shown in FIG. 10 during subsequent thermal cycle(s) of the fabrication process, as illustrated by the arrows "C". The remaining steps for forming a bipolar transistor, such as metallization and collector formation, are performed in a conventional fashion.

The present method substantially prevents emitter defects and provides numerous advantages, which include greater manufacturability of high performance bipolar transistors, production of devices having more uniform device characteristics, and production batches having relatively high resulting chip yields. Other advantages are the use of commonly available equipment and relatively simple and highly reproducible process integration. The present method also increases the manufacturing window over comparable methods.

EXPERIMENTAL RESULTS

Embodiments of this invention fabricated according to procedures described above were tested in an experimental lot and the results showed no damage in the emitter region of the resulting bipolar transistors. The results were confirmed by a visual inspection of the emitter area using an optical microscope and a scanning electron microscope. The inspection revealed a surface structure comparable to that of a virgin silicon surface.

While a particular illustrative embodiment of the invention has been shown and described, numerous variations and alternate embodiments will occur to those skilled in the art based on the present disclosure. Accordingly, it is intended that the invention be limited only in terms of the appended claims.

A simplified outline of the several steps in the described process is as follows:

(a) form active area 110 in substrate 114;

(b) form first dielectric etch stop layer 116 on top of active area 110;

(c) form second dielectric layer 118 on top of first dielectric layer 116;

(d) (1) form a doped contact layer 120 on top of said second dielectric layer 118;

(d) (2) form dielectric isolation layer 122;

(e) etch away a portion of said dielectric isolation layer 122, contact layer 120, and second dielectric layer 118 which are substantially aligned with an intrinsic base region 144 of the active area 110, stopping said etching using said first dielectric layer 116 as an etch stop, thus forming emitter opening 124;

(f) (1) form dielectric spacers 126 on the side walls of the emitter opening 124, by depositing a blanket layer 128 of second dielectric material and by dry etching portions of layer 128;

(f) (2) grow a layer of first dielectric material on top of said first dielectric layer 116 in the region between dielectric spacers 126, thus forming thickened (oxide) first dielectric portion 130;

(g) (1) etch away the portions of the second dielectric layer 118 which are aligned with the extrinsic base regions 142A, 142B of said active area 110, thus forming undercut gaps 132A, 132B beneath doped contact layer 120;

(g) (2) etch away the portions of said first dielectric layer 116 which are aligned with the extrinsic base regions 142A, 142B, thus removing (oxide) first dielectric layer portions 116A and 116B from the surface of active area 110 and widening gaps 132A and 132B;

(h) (1) form a blanket layer of doped contact layer material 143, filling in said undercut gaps 132A and 132B;

(h) (2) etch away a portion of said blanket layer of doped contact layer material which is substantially aligned with an intrinsic base region; thus forming contact layer refills 136A and 136B;

(i) form base regions by (1) driving-in dopant from the doped contact layer 120 into the active area 110 to form doped extrinsic base regions 142A and 142B; and (2) implanting ions into the active area 110 to form doped intrinsic base region 144;

(j) form (oxide) mask 138 comprising first dielectric material in the emitter opening 124;

(k) form (nitride) sidewall spacers 146 in the emitter opening 124 from second dielectric layer material;

(l) etch away the portions of first dielectric layer material remaining in the emitter opening 124 which are in substantial alignment with the emitter region 152; and form an emitter structure by forming a doped emitter contact 154 and by driving-in dopant ions from said emitter contact 154 to form a doped emitter region 152 in said active area 110.

What is claimed is:

1. A method of forming a semiconductor device structure, comprising the steps of:

(a) providing a semiconductor substrate having an active area that includes portions wherein an emitter region and a base region are to be formed, said base region comprising an intrinsic region and at least one extrinsic region wherein said at least one extrinsic region is laterally adjacent to said intrinsic region and said emitter region is vertically adjacent to said intrinsic base region;

(b) forming a first dielectric stop layer on the surface of said active area of said semiconductor substrate;

(d) forming a doped contact layer above said first dielectric stop layer, and forming a dielectric isolation layer above said doped contact layer;

(e) etching away a portion of said contact layer and said dielectric isolation layer which is substantially aligned with said intrinsic base region of said active area, stopping said etching at said first dielectric stop layer to thereby maintain said first dielectric stop layer above said emitter region whereby said emitter region is protected from damage during said etching;

(f) thickening a portion of said first dielectric stop layer which is aligned with said emitter region of said active area;

(g) removing the portions of said first dielectric stop layer which are substantially aligned with said at least one extrinsic base region of said active area and forming said at least one extrinsic base region;

(l) removing the portion of said first dielectric stop layer which is substantially aligned with said emitter region and forming said emitter forming base and emitter region in said active area during subsequent drive-in procedures.

2. The method of claim 1 wherein said first dielectric stop layer has a non-critical thickness.

3. The method of claim 1, further including a step (c) between steps (b) and (d), comprising:

(c) forming a second dielectric layer on the surface of said first dielectric layer;

in which step (e) further comprises etching away a portion of said second dielectric layer which is substantially aligned with said intrinsic base region; and in which step (g) comprises the substeps of (g)(1) etching away the portions of said second dielectric layer which are aligned with said extrinsic base region of said active area, forming a gap above said extrinsic base region;

(g)(2) etching away the portions of said first dielectric layer which are aligned with said extrinsic base region of said active area, widening said gap; and further including a step (h) following step (g) comprising filling in said gap with a contact layer material.

4. The method of claim 3, in which said first dielectric layer comprises an oxide layer and said second dielectric layer comprises a nitride layer.

5. The method of claim 4, in which step (g) comprises:

(g)(1) wet etching said nitride layer in phosphoric acid solution; and (g)(2) wet etching said oxide layer in a buffer solution without substantially damaging the substrate surface in said extrinsic base region.

6. The method of claim 1, in which said step (l) further comprises a wet etch procedure with high selectivity that avoids damage to the emitter region of said semiconductor substrate.

7. The method of claim 1, in which step (f) comprises the substeps of:

(f)(1) forming dielectric spacers on opposing vertical walls of said emitter opening formed in step (e), said spacers being substantially aligned at the edges of said intrinsic base region; and (f)(2) growing a layer of first dielectric material between said dielectric spacers;

wherein said spacers confine the growth of said first dielectric material during substep (f)(2) to a region on the surface of said semiconductor substrate which is aligned with said intrinsic base region.

8. The method of claim 7, further including a step (c) between steps (b) and (d), comprising:

(c) forming a second dielectric layer on the surface of said first dielectric stop layer;

in which step (e) further comprises etching away a portion of said second dielectric layer which is substantially aligned with said intrinsic base region; and in which step (g) comprises the substeps of (g)(1) etching away the portions of said second dielectric layer which are aligned with said extrinsic base region of said active area, forming a gap above said extrinsic base region;

(g)(2) etching away the portions of said first dielectric stop layer which are aligned with said extrinsic base region of said active area, widening said gap; and further including a step (h) comprising filling in said gap with contact layer material.

9. The method of claim 8, in which:

said first dielectric stop layer comprises an oxide said second dielectric layer comprises a nitride layer;

said contact layer material comprises polysilicon;

step (e) comprises an anisotropic reactive ion etch;

substep (g)(1) further comprises wet etching said nitride layer and said dielectric spacers in a phosphoric acid solution; and substep (g)(2) further comprises wet etching said oxide layer in a buffer solution without substantially damaging the substrate surface in the extrinsic base region.

10. The method of claim 9, including a step (h) that comprises:

(h)(1) forming a layer of polysilicon material above said intrinsic base region and in said gap; and (h)(2) etching away a portion of said polysilicon material which is substantially aligned with said intrinsic base region.

11. The method of claim 1, in which said first dielectric stop layer has a thickness of between 100 and 300 angstroms.

12. A method of forming a semiconductor device structure wherein said device comprises an emitter region and a base region and said base region comprises an intrinsic region and at least one extrinsic region laterally adjacent to said intrinsic region, and said emitter region is vertically adjacent to said intrinsic base region, said method comprising the steps of:

(a) providing an active area in a semiconductor substrate;

(b) forming an oxide layer above said active area;

(c) forming a nitride layer above said oxide layer;

(d) forming a contact layer comprising a dopant, above said nitride layer and forming an oxide isolation layer above said nitride layer;

(e) forming an opening in said contact layer, said nitride layer, and said oxide isolation layer, respectively, said opening being substantially aligned with an intrinsic base region to be subsequently formed in said active area;

(g) removing portions of said nitride layer and said oxide layer which are substantially aligned with an extrinsic base region to be subsequently formed in said active area;

(h)(1) depositing poly layer material in said removed portions of step (g) and in said opening of step (e); and (h)(2) removing the portion of said contact layer material which is aligned with said intrinsic base region while a portion of said oxide layer of step (b) protects the active area surface.

13. The method of claim 12, in which said oxide layer is formed to a thickness of at least 100 angstroms.

14. The method of claim 12, in which step (g) further comprises the substeps of:

(g)(1) etching at least one gap in said nitride layer, said gap being aligned above said extrinsic base region; and (g)(2) etching said oxide layer from the surface of said substrate in said gap.

15. The method of claim 14, further including step (f) between steps (e) and (g), comprising the substeps of:

(f)(1) forming nitride spacers on opposing vertical walls of said opening formed during step (e);

(f)(2) thickening said oxide layer between said nitride spacers.

16. The method of claim 15, in which step (e) and substep (h)(2) each comprise a reactive ion etch during which said oxide layer acts as an etch stop.

17. The method of claim 16, in which substep (g)(1) further comprises a wet nitride etch and substep (g)(2) comprises a wet oxide etch having high selectivity.

18. The method of claim 12, further including the steps of:

(i) forming base regions by (1) driving-in dopant from the contact layer into the active area to form doped extrinsic base regions, and (2) implanting ions into the active area to form a doped intrinsic base region;

(j) forming an oxide on the inner surfaces of said opening of step (e);

(k) forming nitride sidewall spacers disposed in said opening of step (e), said spacers substantially aligned at opposing ends of said emitter region;

(l) etching away said oxide layer remaining above said emitter region; and forming an emitter structure by forming a doped emitter poly layer in the opening of step (e), by masking and etching the emitter poly to form an emitter contact, and by driving-in dopant from said emitter poly to form an emitter region in said active area;

wherein damage to said semiconductor surface in said active area is substantially prevented during etch steps (e), (f)(1), (g)(1), (h)(2), and (k) by an oxide etch stop layer and wherein damage to said semiconductor surface is also prevented during etch steps (g)(2) and (l) by using a high selectivity oxide etch procedure.

* * * * *